(12) United States Patent
Chabaud

(10) Patent No.: US 8,338,891 B2
(45) Date of Patent: Dec. 25, 2012

(54) ARRANGEMENT OF MOSFET'S FOR CONTROLLING SAME

(75) Inventor: Antoine Chabaud, Stuttgart-Stammheim (DE)

(73) Assignee: Robert Bosch GmbH, Stuttgart (DE)

( * ) Notice: Subject to any disclaimer, the term of this patent is extended or adjusted under 35 U.S.C. 154(b) by 696 days.

(21) Appl. No.: 11/919,032

(22) PCT Filed: Feb. 24, 2006

(86) PCT No.: PCT/EP2006/060268
§ 371 (c)(1),
(2), (4) Date: Jan. 23, 2009

(87) PCT Pub. No.: WO2006/114344
PCT Pub. Date: Nov. 2, 2006

(65) Prior Publication Data
US 2009/0212367 A1    Aug. 27, 2009

(30) Foreign Application Priority Data

Apr. 25, 2005    (DE) .......................... 10 2005 019 157

(51) Int. Cl.
*H01L 29/66* (2006.01)
(52) U.S. Cl. ................. 257/368; 257/E29.166
(58) Field of Classification Search .................. 257/368, 257/E29.166, 135, 316; 323/222, 224, 225, 323/282, 284, 285
See application file for complete search history.

(56) References Cited

U.S. PATENT DOCUMENTS

| | | | | |
|---|---|---|---|---|
| 5,365,085 A | * | 11/1994 | Tokura et al. | 257/139 |
| 5,656,968 A | * | 8/1997 | Sander et al. | 327/543 |
| 6,222,710 B1 | | 4/2001 | Yamaguchi | |
| 6,653,691 B2 | * | 11/2003 | Baliga | 257/390 |
| 6,867,103 B1 | | 3/2005 | Yu | |
| 2001/0000218 A1 | * | 4/2001 | Yamaguchi | 361/111 |
| 2002/0088989 A1 | | 7/2002 | Kim | |
| 2002/0167056 A1 | * | 11/2002 | Sakamoto | 257/368 |

FOREIGN PATENT DOCUMENTS

| | | |
|---|---|---|
| DE | 34 19 664 | 11/1984 |
| DE | 40 03 389 | 8/1990 |
| DE | 199 18 028 | 11/2000 |
| DE | 100 60 842 | 7/2002 |
| EP | 0 346 978 | 12/1989 |
| EP | 0 594 177 | 5/1999 |
| EP | 0 923 133 | 6/1999 |
| EP | 0 671 056 | 10/2002 |
| JP | 62-256475 | 11/1987 |
| JP | 8-37284 | 2/1996 |
| JP | 2002-542629 | 12/2002 |

* cited by examiner

*Primary Examiner* — Minh-Loan T Tran
*Assistant Examiner* — Fazli Erdem
(74) *Attorney, Agent, or Firm* — Kenyon & Kenyon LLP

(57) ABSTRACT

An arrangement of a plurality of MOSFET's on a chip that includes a first terminal, a second terminal and a third terminal is provided, the arrangement having at least one first MOSFET used as a first control cell and at least one second MOSFET used as a second control cell, each MOSFET having respectively a gate terminal, a source terminal and a drain terminal. The source terminals of all the MOSFET's are connected to one another and contacting the first terminal of the chip. The drain terminal of the at least one second MOSFET, which is used as a power cell, contacts the second terminal of the chip. The gate terminals of all the MOSFET's are connected to one another and contact the third terminal of the chip. The gate terminal and the drain terminal of the at least one first MOSFET, which is used as the first control cell, are connected to one another.

6 Claims, 3 Drawing Sheets

ARRANGEMENT OF MOSFET'S FOR CONTROLLING SAME

BACKGROUND OF THE INVENTION

1. Field of the Invention

The present invention relates to an arrangement of a plurality of MOSFET's ("metal oxide semiconductor field-effect transistor") and a method of controlling the arrangement.

2. Description of Related Art

MOSFET's in integrated circuits are established components in semiconductor technology. In this context, one may make a distinction with regard to their design between horizontal and vertical MOSFET's. Thus the design and manner of functioning of horizontal MOSFET's are known, for example, from published German patent document DE 40 03 389, and of vertical MOSFET's from published European patent document EP 0 671 056 or EP 0 594 177. Vertical MOSFET's have a trench structure and offer the possibility of arranging many transistors in a particularly space-saving manner. The construction of a vertical n-channel MOSFET will now be briefly explained in light of FIG. 1. The MOSFET has three electrical contact areas that are known as source S, gate G and drain terminal D. It is typical for a vertical MOSFET that the drain terminal is not situated together with the two other, source S and gate G terminals on the same side of a semiconductor substrate, which is regarded as being the upper side of the semiconductor substrate. Instead, drain terminal D is situated on a side that is then to be designated as the back surface of the substrate. Therefore, drain terminal D directly contacts the lowest layer of the substrate, namely substrate layer Sub of a first conductivity type n, in this instance, an (N+) layer. On this substrate layer Sub, there is situated a drain region 20 also having first conductivity type n, in this instance, an (N−) layer. The "+" sign denotes a high doping concentration, and the "−" sign correspondingly denotes a low doping concentration. On drain region 20 there is situated a channel region 22 having a second conductivity type p, in this instance, a (p−) layer. In addition, a source region 24 is developed, having conductivity type n, in this case, an (N+) region. A gate electrode 26 fills the inner region of a trench 28, which extends from the upper part of source region 24 all the way through the entire layer thickness of channel region 22, to the upper part of drain region 20. Gate electrode 26 is electrically insulated from the surrounding regions by an insulation 30, made typically of an oxide such as $SiO_2$. Finally, a source electrode 32 is provided which is directly connected to source region 24.

If a voltage is applied between source S and drain terminal D, nevertheless, no current can flow since channel region 22 of (p−) type, that is, a region having many holes and very few electrons, is situated between the two terminals. The MOSFET is in a blocking state, that is, it is nonconductive or "normally off". This blocking state can be removed by changing the electrical conductivity of channel region 22 between source S and drain terminal D by applying a positive voltage at gate terminal G. The positive voltage applied at gate terminal G leads to an enhancement of electrons in a side region of trench 28, between source S and drain region D. The electrons attracted by positive gate electrode 26, as free charge carriers, form a conductive n channel in an otherwise nonconductive channel region 22, that is, the MOSFET is transferred overall to a conductive state. A decrease in the positive gate voltage to zero again yields a blocking MOSFET. Control of the MOSFET state is possible, in principle, by the applied gate voltage.

As was described before, gate electrode 26 is surrounded by an insulation 30. This brings about two capacitive linkages at the MOSFET. As is shown in FIG. 2, first parasitic capacitance 40 comes about between source S and gate terminal G, and second parasitic capacitance 42 comes about between gate G and drain terminal D. If these capacitances 40, 42 are big enough, they lead to electric charges on gate electrode 26 being stored and remaining too, once a voltage has been applied to gate terminal G. In order to switch off the MOSFET again, that is, to transfer it into a blocking state, gate electrode 26 has to be discharged, so that the gate-source voltage is reduced to zero. Otherwise, the MOSFET remains in a conductive state.

Therefore there is a need for a design approach to the objective of being able to transfer the transistor at any time into a blocking state, even in response to a lacking electrical connection between gate electrode 26 and a direct wiring of the transistor.

A BRIEF SUMMARY OF THE INVENTION

The arrangement of MOSFET's according to the present invention has the advantage of making possible a secure control of the MOSFET's. A rapid switchover from a conductive to a blocking state, and vice versa, is achievable at any time. In this design approach, since a direct connection between gate electrode 26 and wiring of the transistor is omitted, possible dangers, such as breaks in the bonding wires and defects in soldering locations do not exist.

Furthermore, it is advantageous that all the MOSFET's necessary for the arrangement are able to be integrated on one chip. Therefore, there is no additional space requirement, such as on an additional printed circuit board. Also, continuing as at present, only three terminals are required on the chip on which the MOSFET's are arranged. A change in the housing, for example, is not provided. For one thing, this is cost-effective in manufacturing, and for another thing, the design approach simplifies installation, since no great additional expenditure is created.

Incidentally, the current-carrying capacity of the MOSFET is also not greatly impaired, since, for controlling the MOSFET, only a few so-called cells are required.

A BRIEF DESCRIPTION OF THE SEVERAL VIEWS OF THE DRAWING

DETAILED DESCRIPTION OF THE INVENTION

Figure 1:
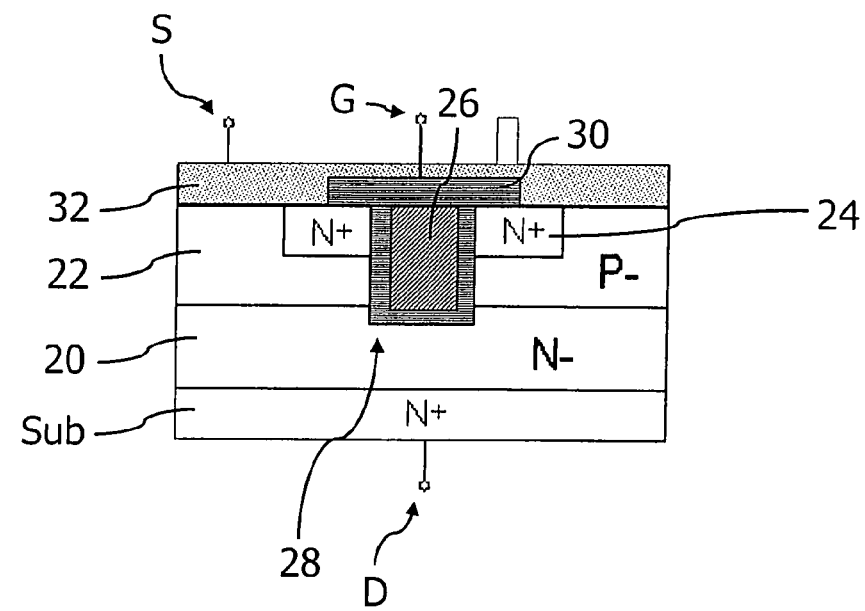
FIG. 1 shows a design of a vertical MOSFET.
Figure 2:
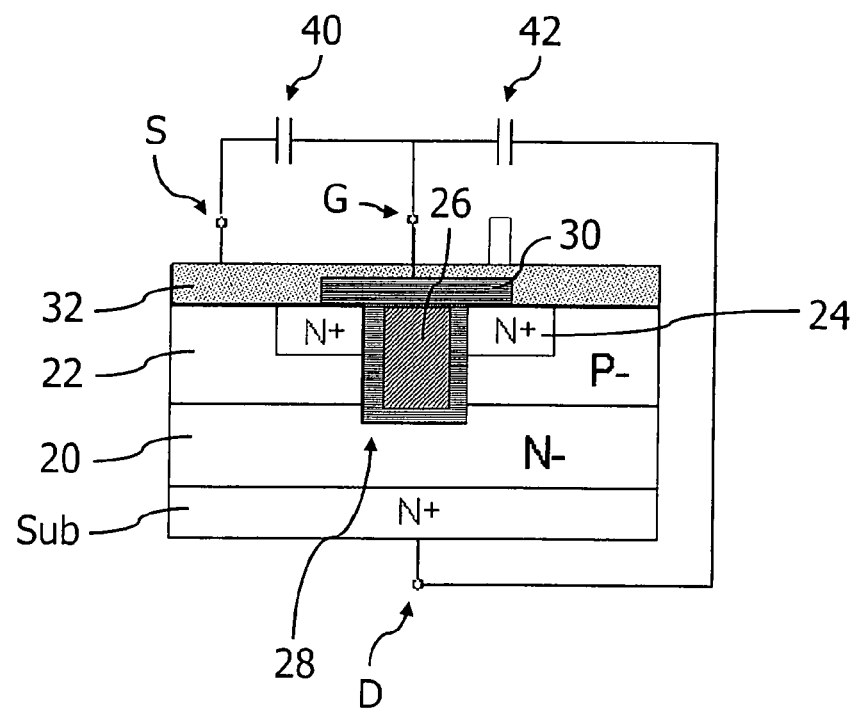
FIG. 2 shows the design of the MOSFET having the parasitic capacitances.

The design and the manner of functioning of a vertical MOSFET has already been explained with the aid of FIG. 1. The nature of the problem of the parasitic capacitances 40, 42, between source terminal S and gate terminal G as well as between gate terminal G and drain terminals D was also discussed, which stem from insulation 30 for gate electrode G. Parasitic capacitances 40, 42 permit charging gate electrode 26, if gate terminal G has applied to it a voltage applied from the outside, or if this voltage is created by outer electrical fields. The MOSFET is able to remain durably in the conductive state because of this charge.

Figure 3:
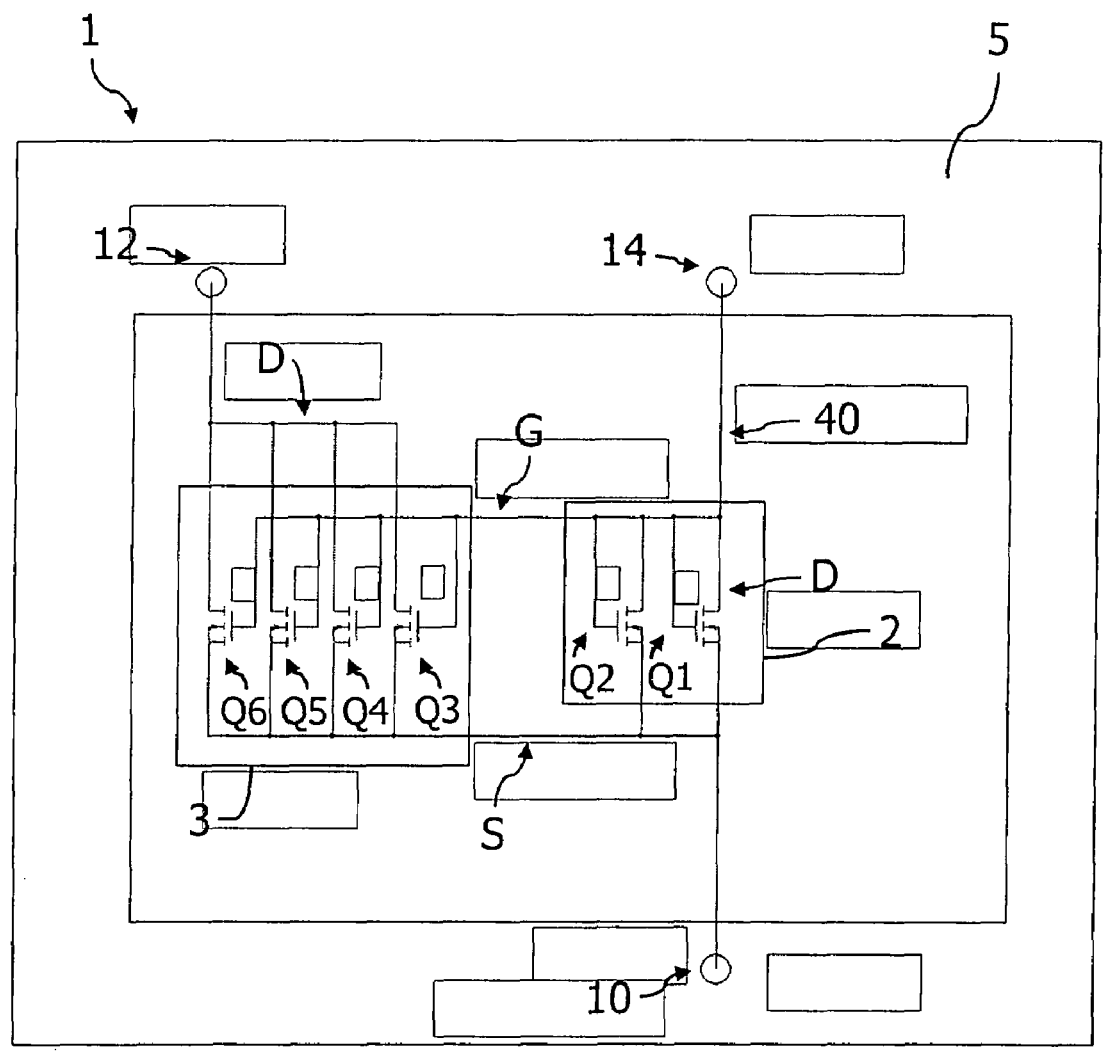
FIG. 3 shows an arrangement of the MOSFET's on a chip.

As may be seen in FIG. 3, an arrangement 1 of a plurality of MOSFET's ("metal oxide semiconductor field-effect transistors") on a chip 5 having a first terminal 10, a second terminal 12 and a third terminal 14 is proposed, having at least one first MOSFET Q1;Q2 used as control cell 2 and at least one second MOSFET Q3;Q4;Q5;Q6 used as control cell 3 having respectively a gate G, source S and drain terminal D, source terminals S of all MOSFET's Q1;Q2;Q3;Q4;Q5; Q6 being connected to one another and contacting first terminal 10 of chip 5, drain terminal D of the at least one second MOSFET Q3;Q4;Q5;Q6 used as power cell 3 contacting second terminal 12 of chip 5, gate terminals G of all MOSFET's Q1;Q2;Q3;Q4;Q5;Q6 being connected to one another and contacting third terminal 14 of chip 5, and gate terminal G and drain terminal D of the at least one first MOSFET Q1;Q2 used as control cell being connected to one another.

Control lines 40 are provided for contacting to third terminal 14. In this arrangement, a secure control is ensured of the at least one second MOSFET Q3;Q4;Q5;Q6 (power cell) by the at least one first MOSFET Q1;Q2 (control cell.

Figure 4A:
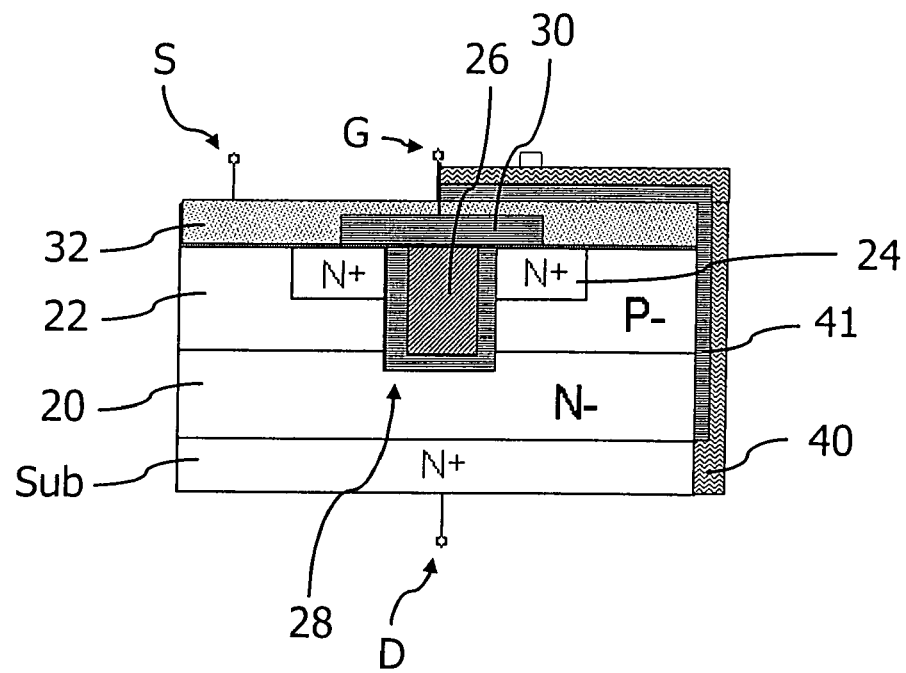
FIGS. 4a and 4b show in each case a design of the MOSFET having a metallic connection between drain D and gate terminals G.
Figure 4B:
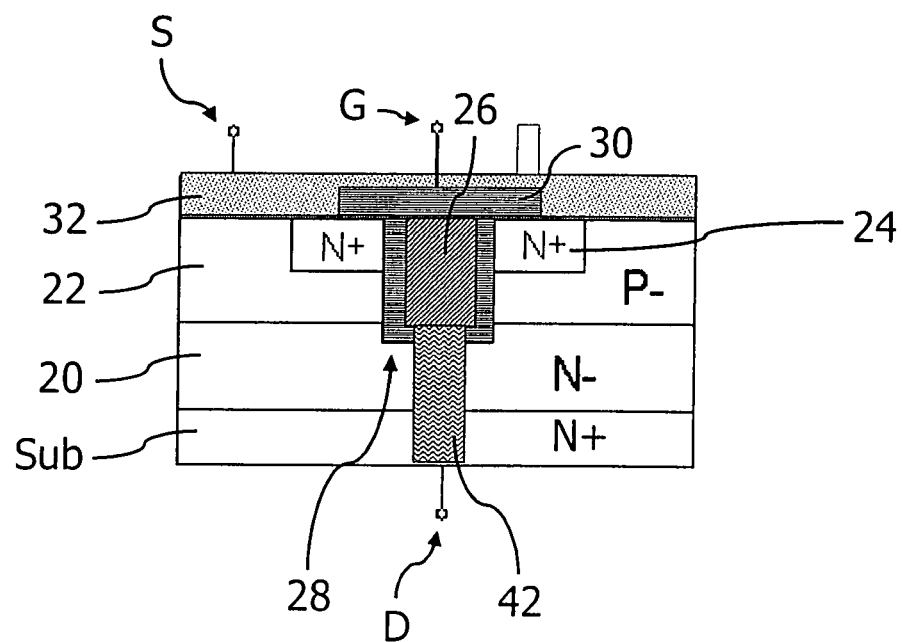

It is advantageous if gate G and drain terminal D of the at least one first MOSFET Q1;Q2 are connected to each other by at least one metallic connection 40, 42 (FIGS. 4a, 4b). If necessary, as shown in FIG. 4a, an intermediate insulator 41 may be provided for metallic connection 40.

Because of the arrangement described of MOSFET's Q1;Q2;Q3;Q4;Q5;Q6, there is a short circuit between drain terminal D and gate terminal G of the at least one first MOSFET Q1;Q2. This type of circuit corresponds to the mirror current circuit that is known per se, described, for example, in published German patent document DE 34 19 664 or published European patent document EP 0 346 978. However, according to the teaching in these documents, the mirror current is designed using bipolar transistors, that is, field-effect transistors are not provided. Furthermore, from published German patent document DE 100 60 842, a mirror current circuit having MOSFET's is known, but it is not intended to provide this arrangement on a chip 5 having three terminals 10, 12, 14, and, in this context, to develop the electrical connections of the terminals according to claim 1.

For, the mirror current circuits in the related art are not used for the secure control or switchover of MOSFET's. Rather, it is described and aimed at, in the documents cited above, that one may generate a current, using the mirror current circuit in an output branch, which as precisely as possible corresponds proportionally to a current flowing in an input branch. Thereby, that is, a current flow is transferred in its strength to another location in the circuit, i.e. it is mirrored. In the related art, the technical motivation of the circuit is clearly different from the motivation of the present document.

The following consideration will explain that the proposed arrangement of the MOSFET's ensures a certain switching off: First of all, let us assume the case in which the connection between first terminal 10 of chip 5 and an external wiring is lacking, or is interrupted. Then there is no connection between chip 5 and ground, so that no current flows in entire chip 5. If the connection between second terminal 12 of chip 5 and an external wiring is lacking, no current flows in the power cells, and no damage to the transistors can occur. Blocking is still possible by third terminal 14 of chip 5. Finally, if it is assumed that the connection between third terminal 14 of chip 5 and an external wiring is lacking, then the charges stored on gate electrodes 26 are discharged by control lines 40, since these are still conductive, as long as the voltages at gate terminal G of the transistors are and remain sufficiently high. However, this is assured as long as enough charges are present on gate electrodes 26. Since all the transistors have the same voltage between gate G and source terminal S and have the same threshold voltage, all the transistors block after the discharge of capacitance 40 between gate G and source terminal S.

In summary, we establish that a reliable control and blocking of the MOSFET's is achieved in all the three cases described.

The application of the arrangement introduced is basically possible using all the known types of MOSFET's. However, vertical MOSFET's are particularly suited. Besides normally off MOSFET's (enhancement mode), normally on MOSFET's (depletion mode) can also be used.

According to FIG. 3, it is provided that the at least one first MOSFET Q1,Q2 is connected in parallel to further MOSFET's Q2,Q1 for the formation of additional control cells 2.

It is also provided that the at least one second MOSFET Q3;Q4;Q5;Q6 is connected in parallel to additional second MOSFET's Q4; Q5; Q6; Q3, for the formation of further power cells.

What is claimed is:

1. A MOSFET arrangement, comprising:
   at least two MOSFETs provided on a chip, wherein the chip includes a first terminal, a second terminal and a third terminal, wherein at least one first MOSFET is used as a control cell and at least one second MOSFET is used as a power cell, and wherein the at least one first MOSFET and the at least one second MOSFET each have a gate terminal, a source terminal and a drain terminal;
   wherein the source terminals of the at least one first MOSFET and the at least one second MOSFET are connected to one another and contact the first terminal of the chip;
   wherein the drain terminal of the at least one second MOSFET contacts the second terminal of the chip;
   wherein the gate terminals of the at least one first MOSFET and the at least one second MOSFET are connected to one another and directly contact the third terminal of the chip; and
   wherein the gate terminal and the drain terminal of the at least one first MOSFET are connected to each other.

2. The arrangement as recited in claim 1, wherein the gate terminal and the drain terminal of the at least one first MOSFET are connected to each other by at least one metallic connection having an intermediate insulator.

3. The arrangement as recited in claim 1, wherein the at least one first MOSFET and the at least one second MOSFET are normally-off MOSFETs.

4. The arrangement as recited in claim 1, wherein at least two first MOSFETs are provided, and wherein the at least two first MOSFETs are connected in parallel to form the control cell.

5. The arrangement as recited in claim 1, wherein at least two second MOSFETs are provided, and wherein the at least two second MOSFETs are connected in parallel to form the power cell.

6. The arrangement as recited in claim 1, wherein the at least one first MOSFET and the at least one second MOSFET are vertical MOSFETS.

* * * * *